(12) United States Patent
Khasnis

(10) Patent No.: US 7,388,524 B2
(45) Date of Patent: Jun. 17, 2008

(54) ENHANCING SIGNAL TO NOISE RATIO OF AN INTERPOLATED SIGNAL

(75) Inventor: Himamshu Gopalakrishna Khasnis, Bangalore (IN)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 11/696,747

(22) Filed: Apr. 5, 2007

(65) Prior Publication Data
US 2007/0236378 A1  Oct. 11, 2007

Related U.S. Application Data

(60) Provisional application No. 60/790,674, filed on Apr. 10, 2006.

(51) Int. Cl.
*H03M 7/00* (2006.01)
(52) U.S. Cl. .......................... 341/61; 341/60; 370/465

(58) Field of Classification Search .............. 341/50–70
See application file for complete search history.

(56) References Cited

U.S. PATENT DOCUMENTS

| 5,928,313 | A * | 7/1999 | Thompson | 708/313 |
| 6,861,968 | B2 * | 3/2005 | Melanson et al. | 341/143 |
| 7,082,143 | B1 * | 7/2006 | LeBlanc et al. | 370/526 |

* cited by examiner

*Primary Examiner*—Lam T Mai
(74) *Attorney, Agent, or Firm*—Steven A. Shaw; W. James Brady; Frederick J. Telecky, Jr.

(57) ABSTRACT

Providing interpolated signals with enhanced signal-to-noise-ratio (SNR). In an embodiment, for each digital sample (of an analog signal) having strength Dn, N values are inserted, with the kth inserted value having a strength of Dn(1+/−Dk), wherein Dk is selected randomly from within a range set according to quantization noise. The received digital samples along with inserted digital values are provided as the interpolated signal corresponding to the input signal represented by the received digital samples.

13 Claims, 6 Drawing Sheets

ENHANCING SIGNAL TO NOISE RATIO OF AN INTERPOLATED SIGNAL

RELATED APPLICATIONS

The present application claims priority from co-pending U.S. provisional patent application entitled, "Novel technique to enhance SNR of the signal while implementing a copy insertion based interpolater", Ser. No. 60/790,674, filed on Apr. 10, 2006, naming as inventor Himamshu Khasnis, and is incorporated in its entirety herewith.

BACKGROUND

1. Field

The present disclosure relates generally to digital signal processing, and more specifically to method and apparatus for enhancing signal to noise ratio at the output of an interpolator.

2. Related Art

Interpolation generally refers to generating additional data points from several input data points. Interpolation is often applied in the context of signal processing, which has the effect of increasing the sampling frequency of the signal from which additional data points are generated. The generated signal is referred to as an interpolated signal.

Noise may be introduced into the interpolated signal during interpolation. It is generally desirable that interpolation be performed while reducing the noise in the interpolated signal, thereby enhancing the signal-to-noise-ratio (SNR).

BRIEF DESCRIPTION OF THE DRAWINGS

The present invention will be described with reference to the following accompanying drawings, which are described briefly below.

DETAILED DESCRIPTION

1. Overview

An aspect of the present invention receives quantized samples of an analog signal and performs zero insertion to a number of times corresponding to the desired degree of interpolation. The zero inserted signal is passed through a filter having a degree equal to the degree of interpolation and coefficients of a unit plus or minus a delta value, with the delta value being set to a random number within a range set according to quantization noise (of the quantized samples).

By using coefficients close to a unit value, the sub-band signals centered at multiples of sampling frequency are filtered. By using unequal coefficients, the SNR of the output signal may be enhanced.

According to another aspect of the present invention, for each digital sample (of an analog signal) having strength Dn, N values are inserted, with the kth inserted value having a strength of $Dn(1+/-Dk)$, wherein Dk is selected randomly from within a range set according to quantization noise. The received digital samples along with inserted digital values are provided as the interpolated signal corresponding to the input signal represented by the received digital samples.

Several aspects of the invention are described below with reference to examples for illustration. It should be understood that numerous specific details, relationships, and methods are set forth to provide a full understanding of the invention. One skilled in the relevant art, however, will readily recognize that the invention can be practiced without one or more of the specific details, or with other methods, etc. In other instances, well known structures or operations are not shown in detail to avoid obscuring the features of the invention.

2. Example Component

Figure 1:
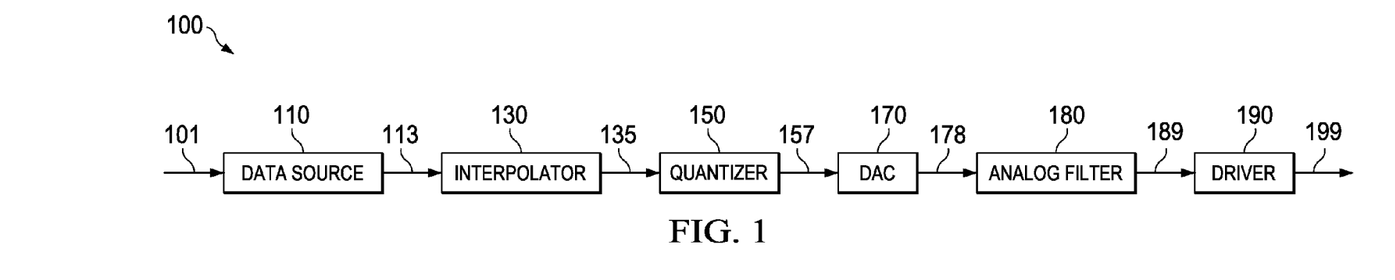
FIG. 1 is block diagram illustrating an example data processing sequence in a transmitter.

FIG. 1 is block diagram illustrating an example data processing sequence of a transmitter 100 in which several aspects of the present invention can be implemented. Transmitter 100 is shown containing data source 110, interpolator 130, quantizer 150, digital analog converter (DAC) 170, Analog filter 180, and driver 190. Each block is described below in further detail.

Data source 110 provides samples on path 113 at a desired frequency/rate. The rate at which the signal points are provided on path 113 may be referred to as sampling frequency. Data source 110 may contain the samples in the form of files such as image file, audio files etc. Alternatively, data source 110 may receive the signal points on path 101 from other signal processing blocks (not shown) from within or outside of transmitter 100. For example, signal points may be received from an analog to digital converter (ADC), sampler/quantizer or previous stage interpolaters that are employed in transmitter 100. The signal points may be provided as digital code or as analog samples.

The signal points (samples) provided on path 113 may represent quantized samples of an input signal desired to be transmitted/processed. As a result, the input signal contains quantization noise due to inherent quantization error in each signal point. The quantization noise level (Nq1) in the input signal on path 113 is computed as:

$Nq1$=Quantization noise power/sampling frequency     Equation 1 wherein quantization noise power $(Np2)=((\Delta 1)^{**}2)/12$     Equation 2

Wherein '**' represents power of operation, '/' division operation, '*' represents multiplication operation, fs represents sampling frequency (data rate), and $\Delta 1$ represents the quantization error on path 113 and is computed as:

Wherein $\Delta 1=(range/(2^{**}N1))$.

Wherein N1 represents the number of bits used for representing each signal point and range represent the peak to peak value of the input signal.

The input signal and the quantization noise level may be represented in a frequency domain representation. Accordingly, FIGS. 2A and 2B respectively represent the input signal and quantized input signal, with Y axis representing magnitude of each frequency component present in the respective signals and X axis representing the frequency of the component. The same convention is used in all the graphs (FIGS. 5A, 5B, 6, 10A, 10B and 10C) of the frequency domain representations.

Figure 2A:
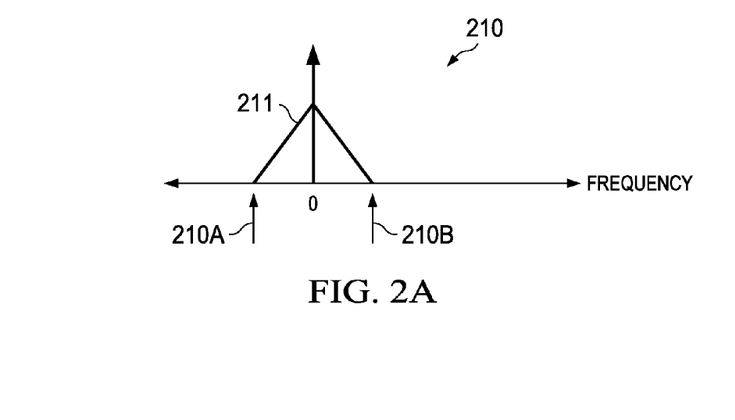
FIGS. 2A and 2B respectively represent the input signal and quantized input signal in frequency domain.
Figure 2B:
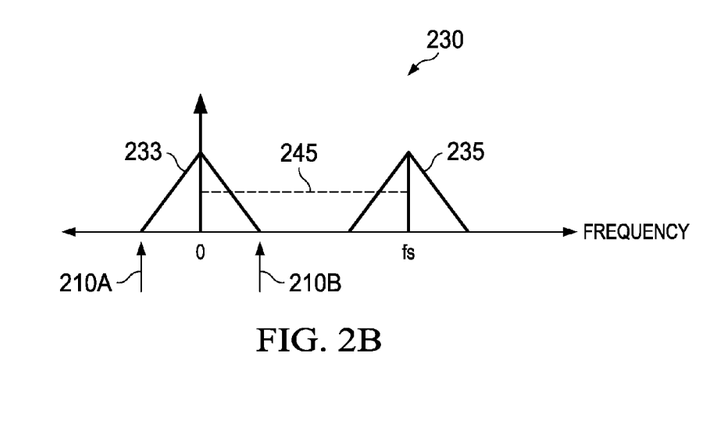

The input signal 210 in FIG. 2A is shown with frequency components in the range of 210A through 210B. Quantized input signal 230 in FIG. 2B is shown with only two signal components 233 and 235 (such pattern repeats at every multiple of fs) separated by sampling frequency fs (assuming greater than twice the value represented by 210B). The quantization noise level Nq1 is shown as line (dotted) 245.

Continuing with reference to FIG. 1, interpolator 130 interpolates the signal points (represented as digital codes) received on path 113 to generate interpolated values (on path 135), representing the input signal (on path 113) with a higher sampling frequency. The number of additional values generated between two successive input digital values plus 1 is referred to as the degree of interpolation.

Quantizer 150 quantizes the interpolated signal received on path 135 and provides the quantized interpolated signal. The quantization noise power of quantizer 150 may be represented as:

Quantization noise power$=((\Delta 2)^{**}2)/12$     Equation 3 wherein $\Delta 2$ represents quantization error of quantizer 150, '**' represents 'power of operator.

The noise level on path 157 depends on the degree of interpolation used by interpolator 130.

It is often desirable that the SNR of the quantized interpolated signal on path 157 be high and the noise be (at least substantially) white. Several features of the present invention provide one or more of such features as described in sections below.

DAC 170 converts each digital value received on path 157 to an analog level, and provides the analog level on path 178. Analog filter 180 converts the analog levels received on path 178 to an analog signal for transmission. Driver 190 drives the analog signal on communication path 199, which can be a wired or a wireless path.

As noted above, interpolator 130 generates a interpolated signal to enhance SNR of the quantized interpolated signal on path 157, as well as keeping the nature of noise as white (frequency independent). The features can be appreciated by considering the need for such an interpolator (in an example scenario) as well as the deficiencies of some prior approaches.

3. Example Prior Approaches

Figure 3A:
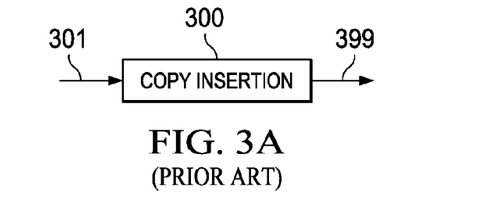
FIG. 3A depicts a copy insertion block operating as an interpolator in one embodiment.
Figure 3B:
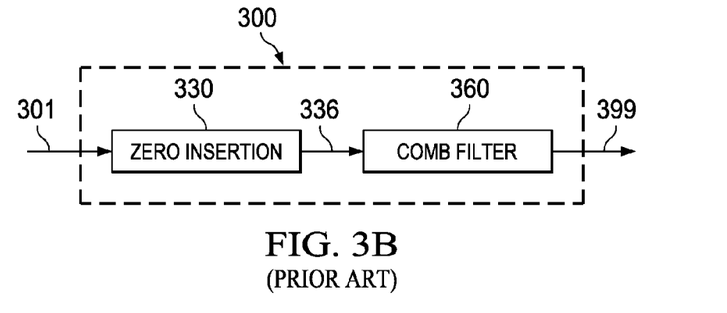
FIG. 3B depicts an example prior implementation of copy insertion block.

FIG. 3A depicts a copy insertion block 300, which operates as an interpolator in one embodiment. FIG. 3B depicts an example prior implementation of copy insertion block 300, and is shown containing zero insertion block 330 and comb filter 360. Each block is described below in further detail.

Zero insertion block 330 inserts a number of zeros (N) (between successive digital values received on path 301), equaling the desired degree of interpolation.

Figure 3C:
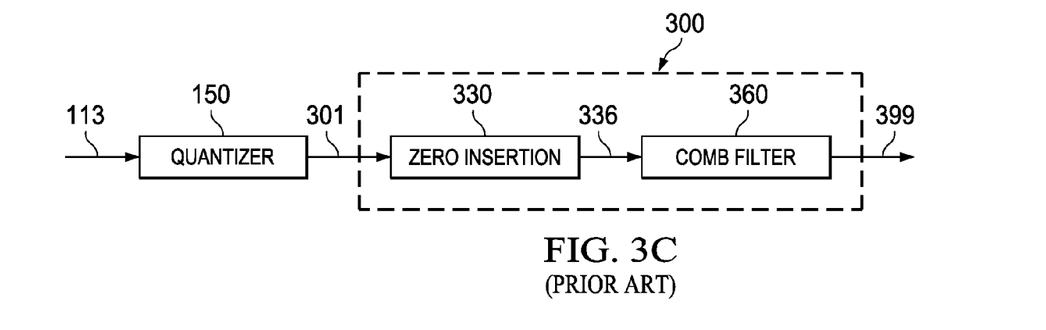
FIG. 3C is a block diagram illustrating the operation of interpolator along quantiser according to prior embodiment
Figure 4:
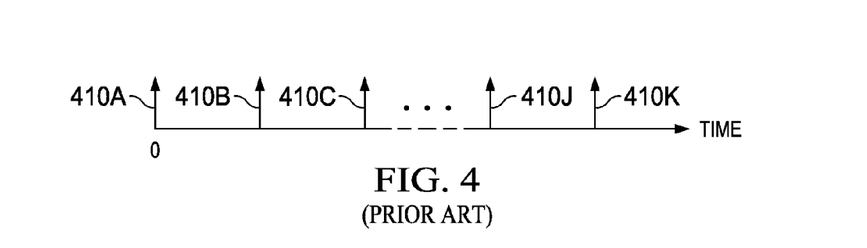
FIG. 4 represents the comb filter in time domain.

Comb filter 360 is implemented with a degree equaling the degree of interpolation. For example, if K zeros are inserted between two successive samples, comb filter 360 may have K unit coefficients, as shown in FIG. 4. Operation of copy insertion 300 in conjunction with quantizer 150 is described below with reference to FIG. 3C. FIG. 3C is a block diagram illustrating the operation of interpolator 300 along with quantizer 150 according to a prior approach of FIG. 3B. Since quantization after copy insertion 300 (combination of zero insertion 330 and comb filer 360) is the same as quantization before copy insertion 300, quantizer 150 is shown prior to the copy insertion 300 (example of prior interpolator 130).

Since quantization is performed on signal (with frequency fs) received on path 113 before interpolation, the quantization noise level Nq2 may be represented as:

$Nq2=Np2/fs$.     Equation 4.

As a result, the quantization noise Nq2 of quantizer 150 and the signal points on path 113 are provided (on path 301) as input to copy insertion 300.

Figure 5A:
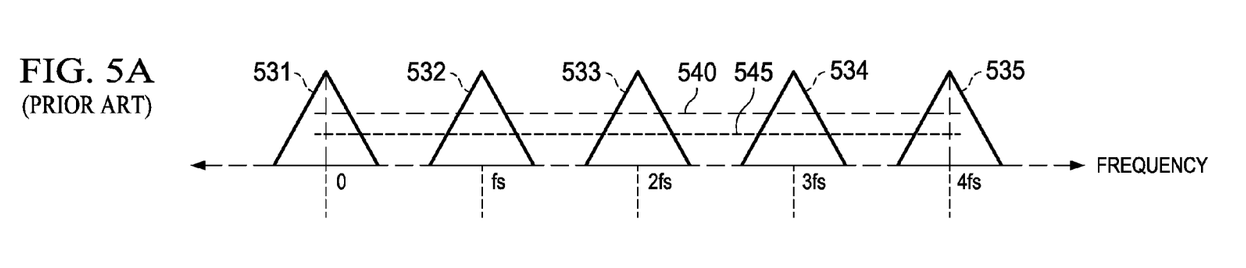
FIG. 5A is a graph representing the effect of zero insertion on the input signal.

FIG. 5A is a graph representing the effect of zero insertion on the input signal on path 301. The graph is shown containing repetitive signal component 531-535, noise level 540 and 545. The graph is described below in further detail.

Repetitive signal components 531-535 separated by a frequency fs (corresponding to sampling frequency on path 113) for N=4. Noise level 540 represents the quantization noise Nq2 that is effectively provided at the input of zero insertion 330 by quantizer 150. Noise level 545 represents the quantization noise inherently present in the signal on path 113 as noted above.

Figure 5B:
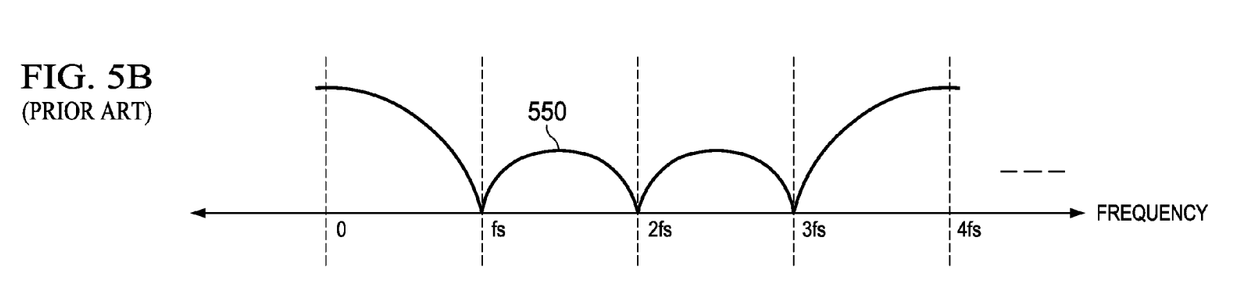
FIG. 5B represents the frequency response of a comb filter for K=4.
Figure 6:
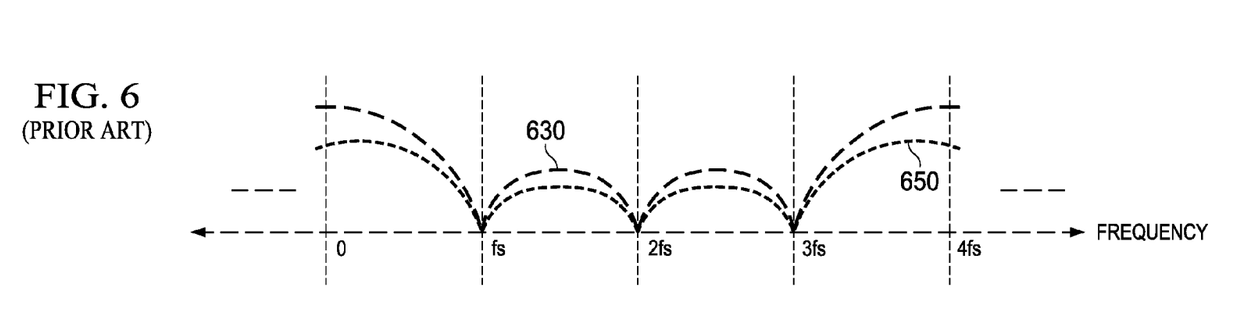
FIG. 6 represents frequency domain representation of noise at the output of comb filter in one prior embodiment.

FIG. 5B represents the frequency response of a comb filter for K=4. FIG. 6 represents frequency domain representation of noise at the output (on path 399) of comb filter 360. FIG. 6 (which represents a multiplication of the respective frequency components on FIG. 5A and FIG. 5B. Path 399 effectively represents the path 157 since quantizer 150 is effectively placed before copy insertion 300 (interpolator 130). FIG. 6 is shown containing noise 630 and 650 respectively corresponding to noise level 540 and 545.

It may be noted from the above description that the noise power of quantizer 150 is effectively divided by fs thereby increasing the effective noise level on path 157. Further noise Nq2 is frequency dependent due to the effect of correlation of white noise with the coefficients of comb filter 360. In particular, multiplication of white noise (line 540) with frequency response of comb filter (curve 550 of FIG. 5B) results in correlated non-white noise 650, which is not desirable.

Various aspects of the present invention overcome one or more of the problems noted above and/or meet one or more of the requirements noted above, as described below in further detail.

4. Interpolator with Enhanced SNR

Figure 7:
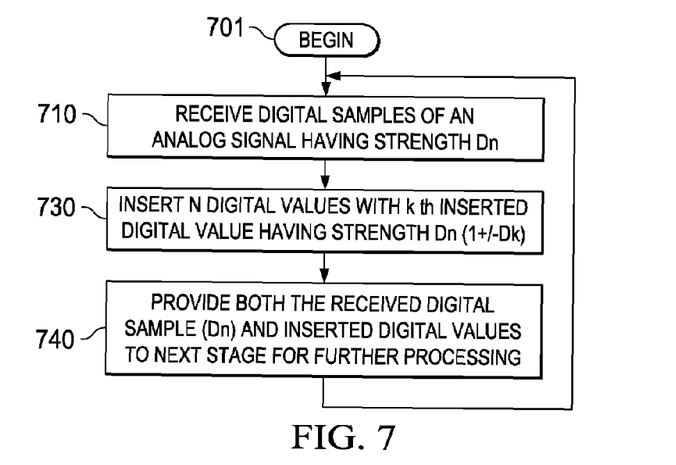
FIG. 7 is a flowchart illustrating the operation of an interpolator according to an aspect of the present invention.

FIG. 7 is a flowchart illustrating the operation of an interpolator according to an aspect of the present invention. The flowchart is described with respect to FIG. 1 merely for illustration. However, the flowchart can be implemented in various other environments also, without departing from the scope and spirit of several aspects of the present invention, as will be apparent to one skilled in the relevant arts by reading the disclosure herein. The flowchart begins in step 701 and control passes to step 710.

In step 710, interpolator 130 receives a digital sample of an analog signal having strength Dn, wherein Dn can represent any digital value. The sample may be received on path 135.

In step 730, interpolator 130 inserts N digital values with kth inserted digital value having strength Dn (1+/−Dk), wherein Dk is a randomly selected value with in a range, '+' represents addition operation and '−' represents subtraction operation. The range needs to be selected as a small value to avoid substantial drift of the center frequency (e.g., 241) of the sub-bands (e.g., 231).

However, Δk needs to be some value to eliminate the correlation effect described above with respect to FIG. 6. By having random component in the inserted digital values, the correlation and the noise level noted above (with respect to FIG. 6) may be reduced, thereby enhancing the SNR of the interpolated signal.

In an embodiment, the range is set to −10% to +10% of Dn. Alternatively, the range can be set to the +/−10% of quantization noise, wherein quantization noise (Q) is computed according to:

$$Q = ((\Delta n)^{**}2)/12 \qquad \text{Equation (5)}$$

wherein '' represents power of operation, '/' division operation, n represents the number of bits in each sample generated by ADC 130 to represent a sample, and $$\Delta n = (\text{Peak to peak}/2^{}n) \qquad \text{Equation (6)}$$

wherein Peak to peak represents the total range of the strength of the input signal and n the number of bits used to represent the total range, as is well known in the relevant arts.

In step 740, interpolator 130 provides both the received digital sample (Dn) and inserted digital values to next stage for further processing. Control passes to step 710 assuming there are additional samples to be processed.

Interpolaters consistent with at least some of the features of FIG. 7 can be implemented using various approaches. The description is continued with respect to the details of an embodiment of interpolator 130.

5. Example Implementation of an Interpolator

Figure 8:
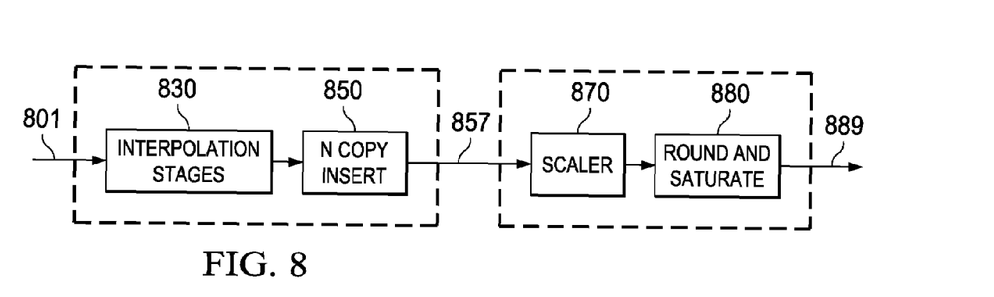
FIG. 8 is a block diagram illustrating the manner in which interpolator can be implemented in conjunction with signal conditioner in one embodiment of the present invention.

FIG. 8 is a block diagram illustrating the manner in which interpolator 130 can be implemented in conjunction with signal conditioning operation, in one embodiment. Interpolator 130 is shown containing interpolation stages 830 and N-copy insert block 850. Signal conditioning operation is often performed to provide signal points with a desired amplitude range. Signal conditioning is shown containing scaler 870 and round and saturate block 880. Each block is described below in further detail.

N copy insert 850 represents a stage in which N copies of a digital value are inserted. Interpolation stages 830 represents multiple stages of interpolation, with some or all stages potentially implemented as N copy insert 850. For example, assuming an interpolation factor of 90, 10 stages may be used with each stage generating 9 additional signal points.

Scaler 870 performs random scaling operation of Dn (1+/−Dk) noted above in step 730, from the samples inserted using the N copy insert blocks noted above. Accordingly, path 857 may contain additional communication indicating to which all samples the addition or subtraction needs to be applied by an appropriate convention.

Round and saturate block 880 limits the range of values to a pre-specified range. The output of round and saturate block 880 is provided on path 889.

Due to the random scaling of the samples in scaler 870, the SNR of the signal provided on path 857 is enhanced as described above.

It should be further appreciated that the features described above can be implemented using other approaches. An alternative embodiment is accordingly described below.

6. Alternative Implementation of an Interpolator

Figure 9A:
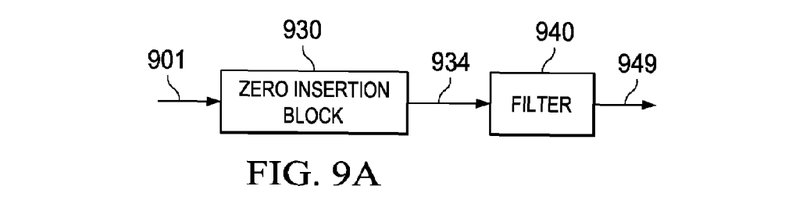
FIG. 9A is a block diagram illustrating the details of interpolator in another embodiment of the present invention.

FIG. 9 is a block diagram illustrating the details of interpolator 130 in another embodiment of the present invention. Interpolator 130 is shown containing zero insertion block 930 and filter 940, which are described below in further detail.

Zero insertion block 930 inserts a number of zeros equaling the desired degree of interpolation between each pair of successive samples received on path 135. Zero insertion block 930 can be implemented using one of several known ways.

Filter 940 may be implemented with a degree equal to the desired degree of interpolation and coefficients of a unity plus or minus a delta value, which can be selected similar to ΔK described above. The filter is thus equivalent to a comb filter, with the coefficiently randomly varying around unity (1).

It should be appreciated that the combination of zero insertion block 930 and filter 940 operates to perform the features of step 730 noted above.

In an embodiment, when the degree of interpolation equals 32, the filter coefficients were randomly selected and equaled 1.0006, 1.0008, 1.0009, 0.999, 1.0002, 1.0002, 0.999, 0.9993, 1.0011, 0.9999, 1.0004, 1.0001, 0.9994, 0.9995, 1.0004, 0.9991, 1.0009, 0.9996, 1.0005, 1.0006, 0.9999, 0.9996, 1.0001, 0.9989, 1.0007, 1.001, 0.9998, 0.9998, 1.001, 0.9991, 0.9992, and 0.9994.

The manner in which the resulting randomness causes the noise level on path 157 to be reduced and to be more independent of frequency (at least compared with curve 630 of FIG. 6 described above) is described below with respect to FIGS. 9B, and 10A-10C.

Figure 9B:
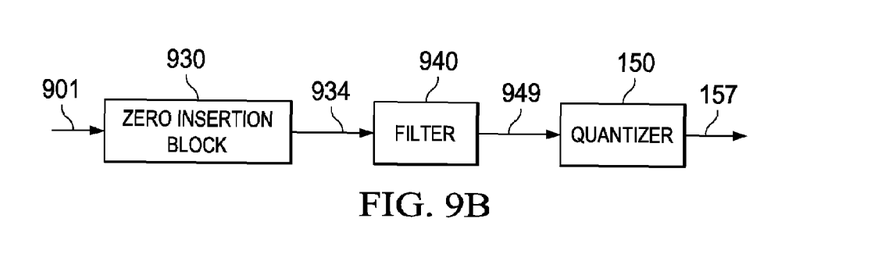
FIG. 9B represents the operation of interpolator and quantiser in one embodiment of the present invention.

FIG. 9B represents the operation of interpolator 130 and quantizer 150 in one embodiment. The quantizer is shown quantizing the interpolated signal 949 provided by filter 940. As a result, the quantization noise level Nq2 may be determined as:

$$Nq2 = Np2/(fs^*N) \qquad \text{Equation 7}$$

wherein N represents the degree of interpolation.

As a result the quantization noise level Nq2 is reduced by a factor N compared to Equation 4 of a prior embodiment described above. Further, since quantization Noise Nq2 is not passed through the filter 940 (as against FIG. 3C of prior embodiment) the noise Nq2 is not correlated and maintains the randomness (white).

Such a feature is obtained since, the quantizer 150 quantizes the random signal points as against the copied signal points in case of prior art of FIG. 3B.

Figure 10A:
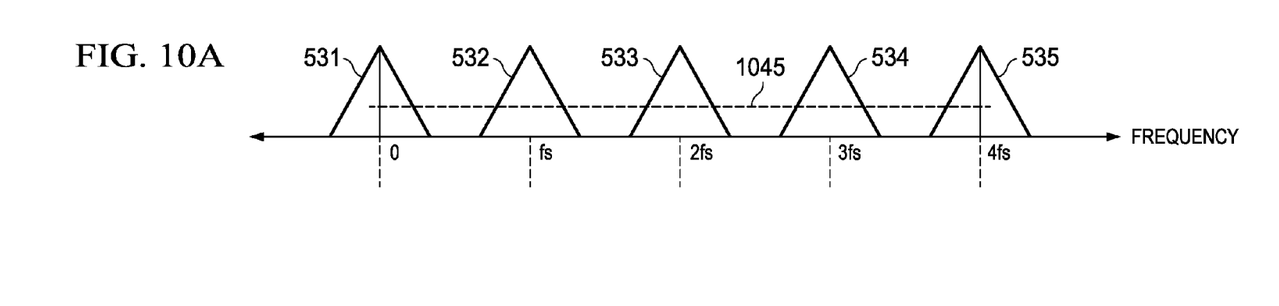
FIG. 10A represents the frequency domain representation of output of a zero insertion block.

FIG. 10A represents the frequency domain representation of output of zero insertion block 930. The graph is provided for N=4. It may be appreciated that only noise 1045 corresponding to inherent quantization noise 245 is present.

Figure 10B:
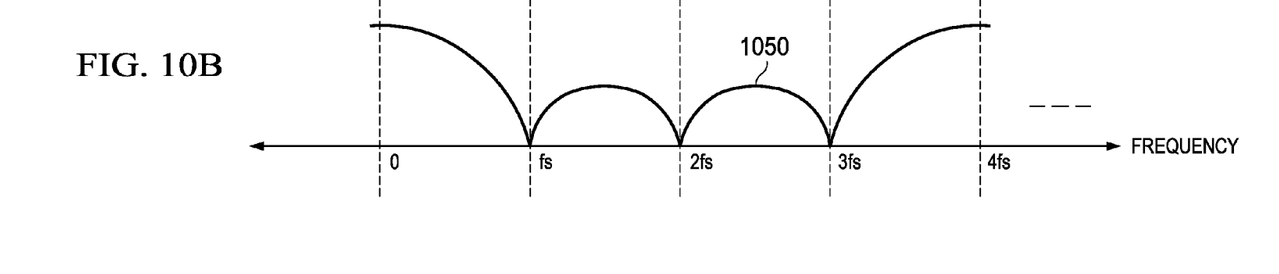
FIG. 10B represents the frequency response of filter implemented according to present invention.

FIG. 10B represents the frequency response of filter 940. It maybe appreciated that the frequency response has nulls at frequency fs, 2 fs, etc. as desired. Such features are attained by keeping the coefficients of the filter to vary only by ΔK (small value) from unity.

Figure 10C:
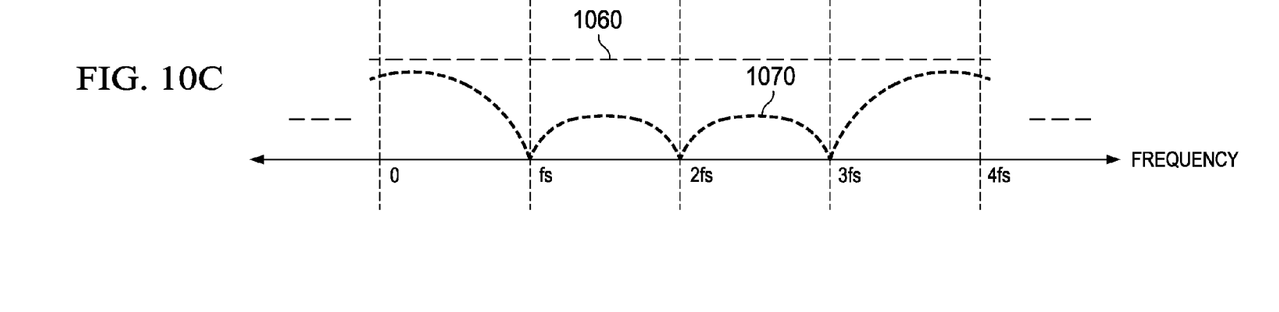
FIG. 10C represents the frequency domain representation of noise.

FIG. 10C represents the frequency domain representation of noise on path 157. The graph is shown containing noise 1070 and 1060. Noise 1070 corresponds to quantization noise 245.

Noise 1060 represents the noise component from quantizer 150. The noise level of noise 1060 equals (based on Equation 7 above, with degree of interpolation N=4)

$$Nq2 = Np2/(fs*4) \qquad \text{Equation 8}$$

As a result noise 1060 is 6 db less than noise 630. Further noise 1060 is white as compared to noise 630.

Figure 11:
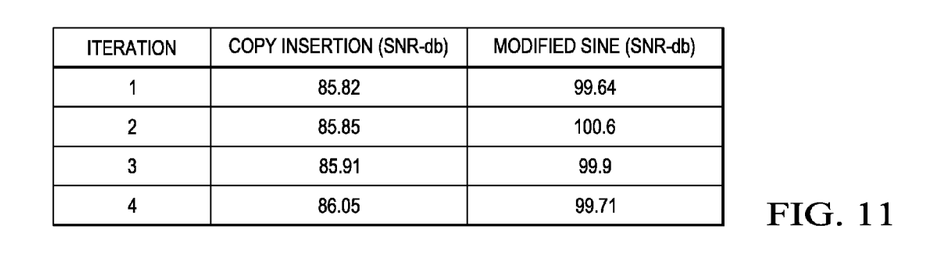
FIG. 11 is a table representing the benefits in an example scenario.

FIG. 11 is a table representing the benefits in an example scenario. The first column indicates the degree of interpolation, the second column indicates the SNR in a prior embodiment and the third column the SNR by applying some of the approaches described above. As may be readily noticed, the SNR is higher in the third column compared to the second column.

Though the above embodiments have been described in digital domain, it should be appreciated that several alternative embodiments can be implemented in analog domain without departing from the scope and spirit of several aspects of the present invention.

In one such analog embodiment, zero insertion block 930 of FIG. 9 receives analog samples (potentially directory from sampler 110) and inserts additional signal points of zero strength (e.g., 0 volts in voltage operation). The intermediate signal on path 934 is then processed by filter 940 in analog domain. Filter 940 may have the same transfer function as that described above.

It should be further appreciated that the features described above can be implemented in various embodiments as a desired combination of one or more of hardware, software and firmware. The description is continued with respect to an embodiment in which various features are operative when software instructions are executed.

7. Digital Processing System

Figure 12:
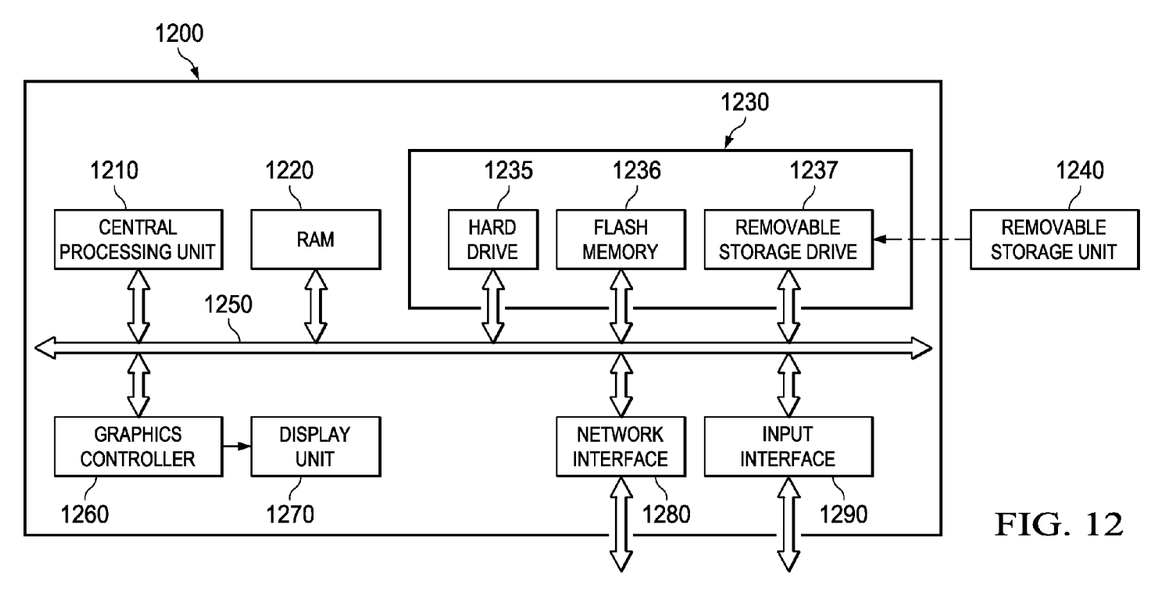
FIG. 12 is a block diagram of digital processing system illustrating an example system in which various aspects of the present invention can be implemented In the drawings, like reference numbers generally indicate identical, functionally similar, and/or structurally similar elements. The drawing in which an element first appears is indicated by the leftmost digit(s) in the corresponding reference number.

FIG. 12 is a block diagram of digital processing system illustrating an example system (e.g., embedded system) in which various aspects of the present invention can be implemented. System 1200 may correspond to interpolator 130 using which additional signal points may be generated. Computer system 1200 may contain one or more processors such as central processing unit (CPU) 1210, random access memory (RAM) 1220, secondary memory 1230, graphics controller 1260, display unit 1270, network interface 1280, and input interface 1290. All the components except display unit 1270 may communicate with each other over communication path 1250, which may contain several buses as is well known in the relevant arts. The components of FIG. 12 are described below in further detail.

CPU 1210 may execute instructions stored in RAM 1220 to provide several features of the present invention. For example, signal processing tool may receive signal points in digital representation to perform various steps of FIG. 7, provide for generating the additional signal points as described above.

CPU 1210 may contain multiple processing units, with each processing unit potentially being designed for a specific task. Alternatively, CPU 1210 may contain only a single processing unit. RAM 1220 may receive instructions from secondary memory 1230 using communication path 1250.

Graphics controller 1260 generates display signals (e.g., in RGB format) to display unit 1270 based on data/instructions received from CPU 1210. Display unit 1270 contains a display screen to display the images defined by the display signals. Input interface 1290 may correspond to a key_board and/or mouse, and generally enables a user to provide inputs. Network interface 1280 enables some of the inputs (and outputs) to be provided on a network. In general, display unit 1270, input interface 1290 and network interface 1280 enable a user to design an integrated circuit.

Secondary memory 1230 may contain hard drive 1235, flash memory 1236 and removable storage drive 1237. Secondary storage 1230 may store the software instructions (which perform the actions specified by various flow charts above) and data (e.g., coefficients of comb filter), which enable computer system 1200 to provide several features in accordance with the present invention.

Some or all of the data and instructions may be provided on removable storage unit 1240, and the data and instructions may be read and provided by removable storage drive 1237 to CPU 1210. Floppy drive, magnetic tape drive, CD_ROM drive, DVD Drive, Flash memory, removable memory chip (PCMCIA Card, EPROM) are examples of such removable storage drive 1237.

Removable storage unit 1240 may be implemented using medium and storage format compatible with removable storage drive 1237 such that removable storage drive 1237 can read the data and instructions. Thus, removable storage unit 1240 includes a computer readable storage medium having stored therein computer software and/or data. An embodiment of the present invention is implemented using software running (that is, executing) in computer system 1200.

In this document, the term "computer program product" is used to generally refer to removable storage unit 1240 or hard disk installed in hard drive 1235. These computer program products are means for providing software to computer system 1200. As noted above, CPU 1210 may retrieve the software instructions, and execute the instructions to provide various features of the present invention.

8. Conclusion

While various embodiments of the present invention have been described above, it should be understood that they have been presented by way of example only, and not limitation. Thus, the breadth and scope of the present invention should not be limited by any of the above described exemplary embodiments, but should be defined only in accordance with the following claims and their equivalents.

What is claimed is:

1. An article of manufacture comprising:
    an interpolator circuit to generate an interpolated signal from an input signal with a degree of interpolation, said interpolator circuit comprising:
        an insertion block inserting a plurality of signal points having zero strength between a pair of successive samples of said input signal to generate an intermediate signal; and
        a filter processing said intermediate signal, wherein said filter contains a number of coefficients equaling said degree, each of said coefficients having a value equaling (1+/−Δk), wherein Δk represents a random number with a small value, '+' represents an addition operation, '−' represents a subtraction operation and '/' represents or.

2. The interpolator of claim 1, wherein said input signal is represented as a sequence of digital values, wherein each of said pair successive samples is a corresponding one of said sequence of digital values, and wherein each of said plurality of signal points equals 0.

3. The interpolator of claim 2, wherein said $\Delta k$ is selected as a random number between + or −10% of unity.

4. The interpolator of claim 2, further comprising:
a quantizer receiving said interpolated signal and quantizing signal points on said interpolated signal to generate a plurality of digital values.

5. The interpolator of claim 4, further comprising:
a digital to analog converter (DAC) converting said plurality of digital values to an analog signal;
a filter removing a set of frequency components from said analog signal to generate a filtered signal; and
a driver transmitting said filtered signal on a channel.

6. An interpolator circuit for interpolating an input signal with a degree of interpolation, said interpolator circuit comprising:
means for inserting N signal points between two successive samples of said input signal with kth inserted signal point having strength Dn (1+/−Dk), wherein N equals said degree, Dk is randomly selected value from within a range, wherein one of said two successive samples has a strength Dn, '+' represents addition operation and '−' represents subtraction operation; and
means for providing said two samples and said inserted signal points as an interpolated signal of said input signal.

7. The interpolator circuit of claim 6, wherein said range is defined by −10% of Dn and +10% of Dn.

8. The interpolator circuit of claim 6, wherein said input signal is represented as a sequence of digital values, wherein each of said two successive samples is a corresponding one of said sequence of digital values, and wherein each of said plurality of signal points is also represented as digital values.

9. The interpolator circuit of claim 8, wherein said digital values are quantized by a quantizer, wherein said range is defined by −10% to +10% of quantization noise of said quantizer.

10. A method of interpolating an input signal with a degree of interpolation, said method comprising:
receiving two successive samples of said input signal, wherein one of said two successive samples has a strength Dn;
inserting N signal points between said two successive samples, with kth inserted signal point having strength Dn (1+/−Dk), wherein N equals said degree, Dk is randomly selected value from within a range, '+' represents addition operation and '−' represents subtraction operation; and
providing said two samples and said inserted signal points as an interpolated signal of said input signal.

11. The method of claim 10, wherein said inserting comprises:
copying N times intermediate points of strength Dn between said two successive samples; and
scaling each of said intermediate points with a corresponding scaling factor chosen randomly from a range.

12. The method of claim 10, wherein said inserting comprises:
copying N zeros between said two successive samples; and
processing in a filter said two successive samples with said N zeros in between, wherein said filter has a number of coefficients equaling said degree and each of said coefficients has a value of (1+/−$\Delta k$), wherein $\Delta k$ represents a random number with a small value, '+' represents an addition operation, '−' represents a subtraction operation and '/' represents or.

13. The method of claim 10, wherein said receiving and inserting are performed by a system upon execution of one or more software instructions stored on a computer readable medium.

* * * * *